United States Patent
Raymond et al.

(10) Patent No.: US 10,998,823 B2
(45) Date of Patent: May 4, 2021

(54) BIPOLAR DC-DC CONVERTER TOPOLOGY USING PASSIVE VOLTAGE REVERSAL

(71) Applicant: The Board of Trustees of the Leland Stanford Junior University, Stanford, CA (US)

(72) Inventors: Luke C. Raymond, Redwood City, CA (US); Wei Liang, Stanford, CA (US); Kawin Surakitbovorn, Stanford, CA (US); Juan M. Rivas Davila, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 126 days.

(21) Appl. No.: 16/311,016

(22) PCT Filed: Jun. 26, 2017

(86) PCT No.: PCT/US2017/039318
§ 371 (c)(1),
(2) Date: Dec. 18, 2018

(87) PCT Pub. No.: WO2018/005377
PCT Pub. Date: Jan. 4, 2018

(65) Prior Publication Data
US 2020/0313560 A1    Oct. 1, 2020

Related U.S. Application Data

(60) Provisional application No. 62/354,778, filed on Jun. 26, 2016.

(51) Int. Cl.
*H02M 3/335* (2006.01)
*H02M 1/08* (2006.01)

(52) U.S. Cl.
CPC ......... *H02M 3/33576* (2013.01); *H02M 1/08* (2013.01)

(58) Field of Classification Search
CPC ........... H02M 3/33576; H02M 3/3357; H02M 3/335; H02M 1/08; H02M 1/088
See application file for complete search history.

(56) References Cited

U.S. PATENT DOCUMENTS

| 4,449,174 A | 5/1984 | Ziesse |
| 4,553,199 A * | 11/1985 | Harada ............... H02M 3/3372 363/24 |

(Continued)

FOREIGN PATENT DOCUMENTS

| CN | 101951159 B | 4/2013 |
| CN | 103262400 A | 8/2013 |

(Continued)

OTHER PUBLICATIONS

USPTO. International Search Report and Written Opinion for parent PCT Application No. PCT/US2017/039318 dated Sep. 15, 2017, 5 pages.

(Continued)

*Primary Examiner* — Emily P Pham
(74) *Attorney, Agent, or Firm* — Crawford Maunu PLLC

(57) ABSTRACT

A resonant DC-DC converter for generating high voltage MHz bi-polar DC pulses includes a left multi-level resonant rectifier bank [100] connected to a positive electrode [104] and coupled via capacitive isolation to a left RF amplifier terminal [128]; a right multi-level resonant rectifier bank [102] connected to a negative electrode [106] and coupled via capacitive isolation to a right RF amplifier terminal [130]. Each multi-level resonant rectifier bank comprises multiple resonant rectifier stages [112-122], where each stage comprises two capacitors for capacitively isolating the stage, an output capacitor, a MOSFET switch connected to (Continued)

an adjacent MOSFET switch of an adjacent stage, and a gating resonant circuit connected to the MOSFET switch, whereby MOSFET switches in the banks can be passively controlled by RF signals from a left RF amplifier and a right RF amplifier.

17 Claims, 6 Drawing Sheets

(56) References Cited

U.S. PATENT DOCUMENTS

| | | | |
|---|---|---|---|
| 5,583,421 A | | 12/1996 | Barbehenn et al. |
| 5,722,057 A * | | 2/1998 | Wu .................. H02M 3/335 363/17 |
| 7,889,519 B2 | | 2/2011 | Perreault et al. |
| 10,020,747 B2 * | | 7/2018 | Madsen ................ H02M 3/338 |
| 2003/0090918 A1 | | 5/2003 | Shenai et al. |
| 2012/0043598 A1 | | 2/2012 | de Rochemont |
| 2012/0069606 A1 | | 3/2012 | Sagneri et al. |
| 2015/0303806 A1 | | 10/2015 | Madsen et al. |
| 2015/0381057 A1 * | | 12/2015 | Luu .................... H02M 3/337 363/21.01 |
| 2017/0012535 A1 | | 1/2017 | Raymond et al. |
| 2017/0085189 A1 | | 3/2017 | Madsen |

FOREIGN PATENT DOCUMENTS

| | | |
|---|---|---|
| WO | 2010069620 A1 | 6/2010 |
| WO | 2016202895 A1 | 12/2016 |

OTHER PUBLICATIONS

L. Raymond et al. "13.56 MHz high voltage multi-level resonant DC-DC converter." 2015 IEEE 16th Workshop on Control and Modeling for Power Electronics (COMPEL). 24(3): 408-416. Date of Conference: Jul. 12-15, 2015.
J. Glaser et al. "A 900W, 300V to 50V Dc-dc Power Converter with a 30MHz Switching Frequency", 2009, IEEE 24th Applied Power Electronics Conference, pp. 1121-1128 (2009).
L. Raymond et al. "Resonant Bi-Polar DC Pulse Power Supply for Electroporation Applications." 2016 IEEE 17th Workshop on Control and Modeling for Power Electronics (COMPEL). Date of Conference: Jun. 27-30, 2016. Filed as Appendix of related U.S. Appl. No. 62/354,778.
J. Raso-Pueyo and V. Heinz. "Pulsed electric fields technology for the food industry: fundamentals and applications." Springer Science & Business Media, 2010. Book.
J. Cockcroft and E. Walton, "Experiments with high velocity positive ions," Proceedings of the Royal Society of London. Series A, Containing Papers of a Mathematical and Physical Character, pp. 477-489, 1930.

Z. Zhiguo and Z. Lin, "Analysis and design of isolated flyback voltage-multiplier converter for low-voltage input and high-voltage output applications," Power Electronics, IET, vol. 6, No. 6, pp. 1100-1110, Jul. 2013.
L. Redondo, "A dc voltage-multiplier circuit working as a high-voltage pulse generator," Plasma Science, IEEE Transactions on, vol. 38, No. 10, pp. 2725-2729, Oct. 2010.
J. Sun, X. Ding, M. Nakaoka, and H. Takano, "Series resonant ZCS-PFM DC-DC converter with multistage rectified voltage multiplier and dual-mode PFM control scheme for medical-use high-voltage x-ray power generator," Electric Power Applications, IEE Proceedings -, vol. 147, No. 6, pp. 527-534, Nov. 2000.
H. Canacsinh, J. Silva, S. Pinto, and L. Redondo, "Solid-state bipolar marx generator with voltage droop compensation," in Technological Innovation for Value Creation, ser. IFIP Advances in Information and Communication Technology, L. Camarinha-Matos, E. Shahamatnia, and G. Nunes, Eds. Springer Berlin Heidelberg, 2012, vol. 372, pp. 411-418.
H. Sanders and S. Glidden, "Long lifetime optically triggered solid state marx," in IEEE International Power Modulators and High Voltage Conference, Proceedings of the 2008, May 2008, pp. 13-16.
L. Raymond et al., "27.12 MHz large voltage gain resonant converter with low voltage stress," in Energy Conversion Congress and Exposition (ECCE), 2013 IEEE, Sep. 2013, pp. 1814-1821.
L. Raymond et al., "27.12 MHz isolated high voltage gain multi-level resonant dc-dc converter," in Energy Conversion Congress and Exposition (ECCE), 2010 IEEE, Sep. 2015, pp. 1-7.
J. Zhu, M. Xu, J. Sun, and C. Wang, "Novel capacitor-isolated power converter," in Energy Conversion Congress and Exposition (ECCE), 2010 IEEE, Sep. 2010, pp. 1824-1829.
J. Pedersen, M. Madsen, A. Knott, and M. Andersen, "Self-oscillating galvanic isolated bidirectional very high frequency dc-dc converter," in Applied Power Electronics Conference and Exposition (APEC), 2015 EEE, Mar. 2015, pp. 1974-1978.
Applicant respectfully refers the Examiner to a coexistent patent application of the common Applicant, U.S. Appl. No. 15/199,326, filed Jun. 30, 2016, and published as US 2017-0012535A1 (Luke C. Raymond et al). No attachment.
EPO. Supplementary European Search Report dated Jan. 29, 2020, for related counterpart European Patent Application No. 17821022.5, 8 pages.
Hanifah Jambari et al. Simulation of Cascaded H-Bridge Multilevel Inverter for liquid food sterilization with various distance of the electrodes gap, Industrial Electronics and Applications (ISIEA), 2011 IEEE Symposium on, IEEE, Sep. 25, 2011, pp. 144-148.
Wu T-F et al. Analysis and design of multiswitch driver for high pulsed voltage generators, 35th Annual IEEE Power Electronics Specialists Conference (2004), pp. 787-793.
CIPO. Chinese Office Action dated Jul. 3, 2020, for related counterpart Chinese Patent Application No. 201780050689.0 (15 pages), with English translation.

* cited by examiner

BIPOLAR DC-DC CONVERTER TOPOLOGY USING PASSIVE VOLTAGE REVERSAL

FIELD OF THE INVENTION

The present invention relates generally to resonant DC-DC converters. More specifically, it relates to circuits for generating high voltage DC pulses using resonant rectifiers.

BACKGROUND OF THE INVENTION

Electroporation is a technique that uses high pulsed electric fields to create pores in biological cell walls for medical, liquid sterilization and other applications. Many systems use mono-polar pulses for simplicity but electromigration can limit electrode life.

Electroporation involves generating a large electric field between two conductive electrodes within a liquid. Biological cells exposed to the electric field develop pores in their cell walls. Reversible electroporation involves electric fields in the range of hundreds of volts per mm and can be used to move materials in and out of the cell. Irreversible electroporation, or pulse electric field (PEF) sterilization involves even higher electric fields and is used to usually destroy cell walls in bacteria in potable liquids and foodstuffs. Electroporation requires short pulses ($\approx 10$ s of $\mu s$) in order to limit ohmic heating of the liquid. Monopolar pulses are effective but bipolar pulses have been shown to increase electrode life by reducing electromigration of the conductor.

Conventional approaches for providing DC electrical pulses can be undesirably complicated, especially in cases (e.g., electroporation applications) where the pulses need to be bi-polar and/or need to have flexible pulse profiles.

Methods of generating square bipolar pulses typically consist of traditional high voltage power supplies to generate high voltage DC combined with capacitive discharge to deliver a pulse train. Conventional methods can present difficulties including slow startup, large energy storage within the circuit, voltage droop, limited pulse repetition, and limited pulse width. Gating can also become complicated for multilevel approaches with floating active switches.

BRIEF SUMMARY OF THE INVENTION

The present invention provides, in one aspect, a resonant circuit design for creating high voltage bi-polar DC pulses using a simple control strategy. The circuit includes two multi-level resonant rectifiers employing capacitive isolation and operating at 15 MHz. Each resonant rectifier is coupled at a terminal to a radio frequency (RF) amplifier. The RF signals generated by the amplifiers themselves are used to control the pulse duration and output polarity of the circuit. Any sequence of positive and negative pulse trains can be generated between several $\mu s$ through DC. As an illustrative example, this description presents a specific design providing 800 V positive and negative pulses into a resistive load.

This work provides a power supply for bipolar (or unipolar) and pulsed bipolar (or unipolar) applications capable of short pulses (sub-microsecond to infinite) and efficient operation regardless of pulse length. This approach can be used for low voltages but has significant benefits for high voltage applications over traditional topologies. It allows for the creation of much smaller and lighter bipolar (or faster monopolar) power supplies for applications where weight and size are important considerations. It also likely reduces the cost of the power supply in such applications.

More specifically, a resonant DC-DC converter capable of applying positive or negative voltages to a load in continuous or pulsed form is provided. The method of driving the active switch(es) that control the pulse length and polarity is by harnessing energy from a specific resonant component $L_R$ in the converter structure. The gating signals for the active switch(es) are thus controlled passively such that the controlled switch(es) in the inverter stage are the only switches that require active control.

Applications include but are not limited to: space propulsion, medical plasma, industrial plasma, water treatment, pulse electric field (PEF) sterilization, power inversion, and electroporation.

Significant advantages are provided. This approach leads to much smaller and lighter electrical sources than traditional topologies, especially for high voltage applications. No transformer is necessary for power stage isolation. No complicated gate drives are needed for control of the active switches that deliver the pulse and change the polarity (i.e. optocouplers or other complicated isolated gating methods). No heavy/expensive magnetic materials are needed. Capacitive isolation is possible due to the high frequency of operation. In its simplest realization only two actively controlled switches are necessary and both are ground references.

Using circulating currents in the resonant element $L_R$ (or similar) to generate the isolated gating signals needed to control pulse and polarity profiles of the load is a significant feature. Thus the only control signal that needs to be generated is the ground referenced gating signal for the active switch in the inverter. This allows fast and precise operation without the need for complex active isolated gate drives to deliver the pulses or switch the polarity to the load.

The approach of the present invention introduces a resonant rectifier topology implemented at 15 MHz. By switching at 10's of MHz the size of the energy storage devices in the circuit can be reduced and all magnetic elements can be implemented in air-core. Isolation can be implemented using small ceramic capacitors rather than bulky transformers. Because of the high switching frequency, the transient response of the system is fast enough to produce the necessary square pulses of 10 s of $\mu s$ in real time from an off-state rather than relying on a charging circuit that supplies energy to a relatively large pulse-capacitor that stores the energy applied to the treated liquid during the duration of the short pulse. The discharge circuit consists of either a half-bridge or a full bridge circuit with switching devices rated to at least the maximum voltage applied to the target, which in commercial system can reach 10's of kV. Because of the fast transient response of the resonant rectifier, the rectifier output voltage is essentially in steady state during a pulse, the pulse width can be as long as desired (ms, seconds, DC) unlike many high voltage pulse power supplies (e.g. marx generators). Arcing within air-bubbles or contaminants is often a concern in electroporation. If there is a significant amount of energy stored within the electroporation power supply and an arc occurs, liquids can vaporize explosively. In a 1000 $V_{pkpk}$ design presented herein, there is never more than 75 $\mu J$ of energy stored in any one capacitor because the cycle-cycle energy storage is so low. The presented design can be scaled up in voltage by adding rectifier stages without needing to increase semi-conductor device ratings.

In one aspect, the invention provides a resonant DC-DC converter for generating high voltage MHz bi-polar DC pulses. The resonant DC-DC converter includes a left multilevel resonant rectifier bank connected to a positive electrode and coupled via capacitive isolation to a left RF amplifier terminal; a right multi-level resonant rectifier bank connected to a negative electrode and coupled via capacitive isolation to a right RF amplifier terminal; wherein the left multi-level resonant rectifier bank and the right multi-level resonant rectifier bank are connected at a common node; wherein the left multi-level resonant rectifier bank comprises multiple left resonant rectifier stages; wherein the right multi-level resonant rectifier bank comprises multiple right resonant rectifier stages; wherein each stage of the multiple left resonant rectifier stages and the multiple right resonant rectifier stages comprises two capacitors for capacitively isolating the stage, an output capacitor, a MOSFET switch connected to an adjacent MOSFET switch of an adjacent stage, and a gating resonant circuit connected to the MOSFET switch, whereby MOSFET switches in the the left multi-level resonant rectifier bank and the right multi-level resonant rectifier bank can be passively controlled by RF signals from a left RF amplifier and a right RF amplifier.

In preferred embodiments, the gating resonant circuit comprises an inductor, capacitor, and resistor connected in parallel. The left multi-level resonant rectifier bank is coupled to an inductor $L_{Rp}$, and wherein the right multi-level resonant rectifier bank is coupled to an inductor $L_{Rn}$. Each stage of the multiple left resonant rectifier stages and the multiple right resonant rectifier stages comprises two diodes for rectifying AC signals passing through the two capacitors for capacitively isolating the stage.

DETAILED DESCRIPTION OF THE INVENTION

Figure 1A:
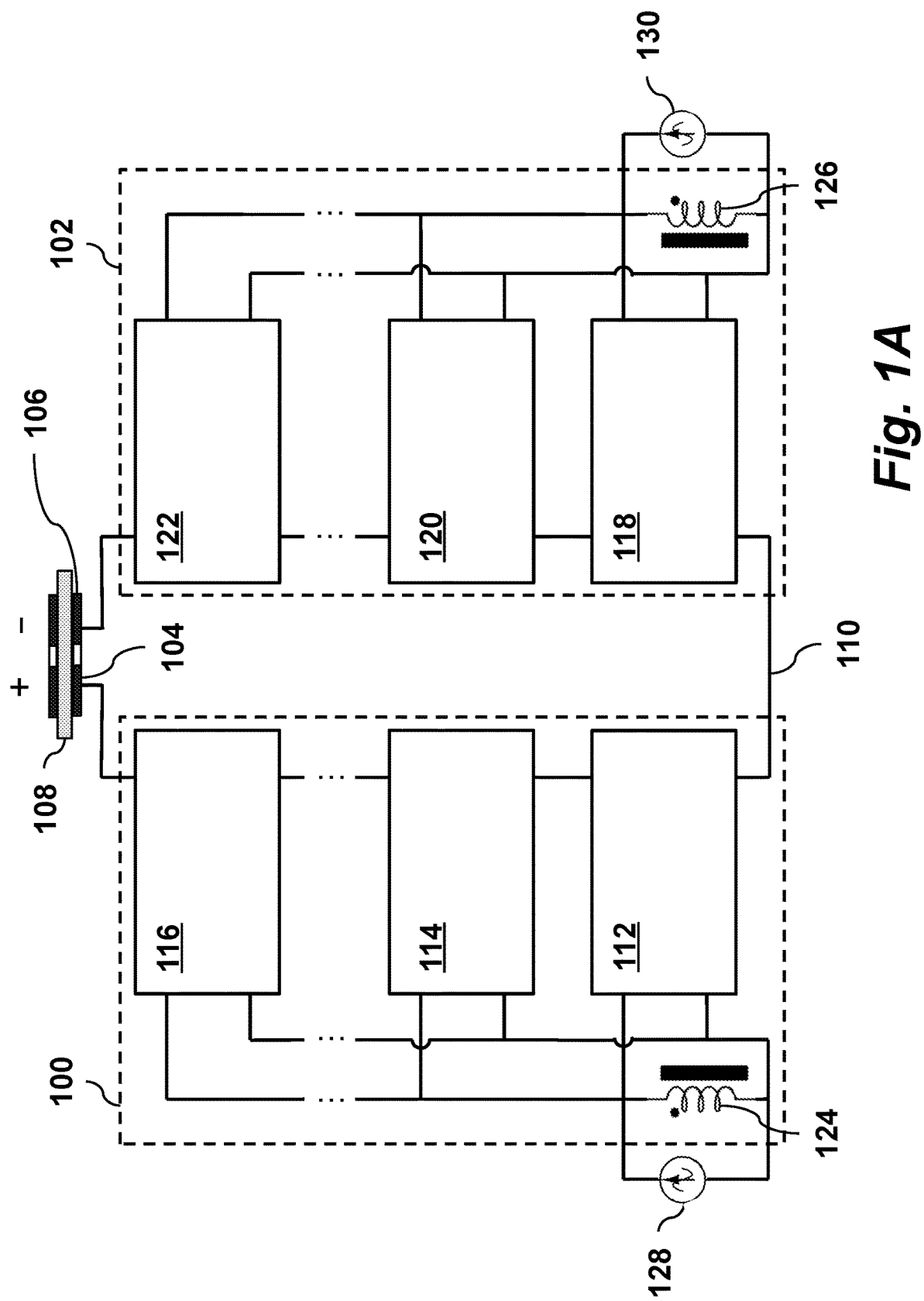
FIG. 1A is a high-level schematic circuit diagram of a multi-lever resonant rectifier with bi-polar output, according to an embodiment of the invention.

FIG. 1A depicts the general structure of the resonant rectifier schematic developed to generate the bipolar pulses for electroporation, according to one embodiment of the invention.

The circuit includes two opposing multi-level isolated rectifiers, left multi-level resonant rectifier bank 100 and right multi-level resonant rectifier bank 102. These are connected to positive and negative electrodes 104 and 106, respectively. For purposes of illustration, the load 108 contacting the electrodes in this figure is a treated liquid for electroporation. The low level of the rectifier banks are tied together to a common node 110. When the left side rectifier is active, the load will experience a positive voltage and when the right side is active the load will experience a negative voltage.

Through capacitive isolation, each rectifier bank may have multiple stages to achieve impedance matching and voltage gain. As shown, left rectifier bank 100 has multiple resonant rectifier stages 112, 114, 116, and right rectifier bank 102 has multiple resonant rectifier stages 118, 120, 122. The individual resonant inductors of the stages 112, 114, 116 can be combined into a single smaller value inductor 124 ($L_{Rp}$). Similarly, the individual resonant inductors of the stages 118, 120, 122 can be combined into a single smaller value inductor 126 ($L_{Rn}$). Each resonant rectifier bank is coupled at a terminal to a corresponding radio frequency (RF) amplifier (not shown). A left RF signal is coupled to the left rectifier bank at terminal 128 and a right RF signal is coupled to the right rectifier bank at terminal 130. The RF signals control the pulse duration and output polarity of the circuit.

Figure 1B:
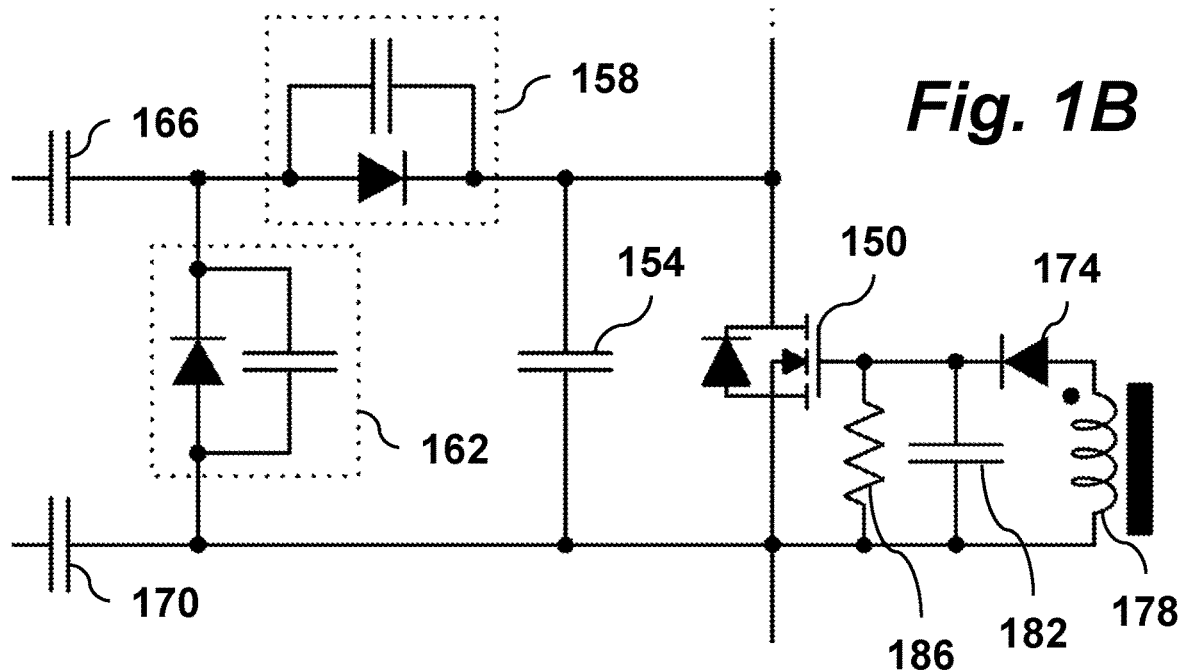
FIG. 1B is a schematic circuit diagram of a positive resonant rectifier stage of FIG. 1A.
Figure 1C:
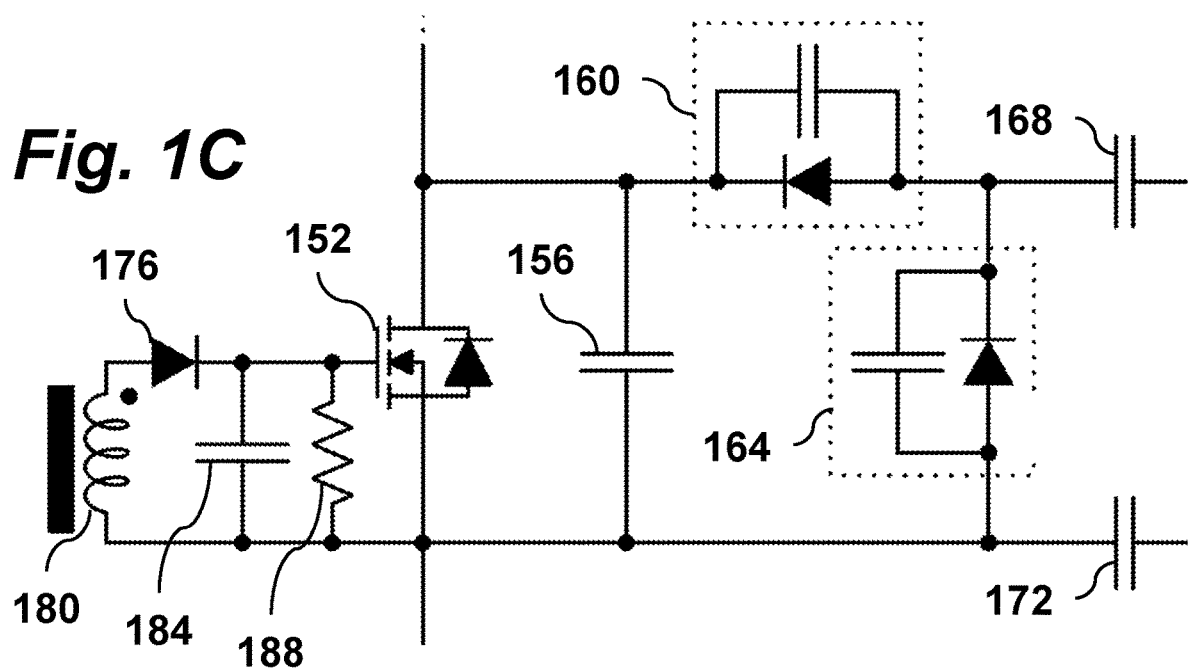
FIG. 1C is a schematic circuit diagram of a negative resonant rectifier stage of FIG. 1A.

Each left resonant rectifier stage 112, 114, 116 has the structure shown in FIG. 1B. Similarly, each right resonant rectifier stage 118, 120, 122 has the structure shown in FIG. 1C. The left and right stages are mirror images of each other, so we will describe them in parallel. Each stage has a MOSFET switch 150, 152 ($Q_{1p}$, $Q_{1n}$) placed in parallel with an output capacitor 154, 156 ($C_{op}$, $C_{on}$). The opposite ends of these circuit elements are connected to adjacent stages, providing a connection between the electrodes and the bottom node 110. Each stage also includes a gating resonant circuit with an inductor 178, 180 ($W_{g1}$, $W_{g2}$), capacitor 182, 184 ($C_{g1}$, $C_{g2}$), and resistor 186, 188 ($R_{g1}$, $R_{g2}$), all connected in parallel. The gating resonant circuit also includes a diode 174, 176. The inductors $W_{g1}$ and $W_{g2}$ are coupled with $L_{Rp}$ and $L_{Rn}$ to provide an isolated AC signal. Diodes 174 and 176 rectify the AC signal, and $C_{g1}$ and $C_{g2}$ act as filtering elements to provide a stable DC gating signal to keep the MOSFET on during a pulse. It is possible to use the internal gate capacitance of the switches as $C_{g1}$, $C_{g2}$. Resistors $R_{g1}$, $R_{g2}$ act as pull-down resistors to turn off the gate when the AC signal is not present.

The left rectifier stage is capacitively isolated from the RF signal by a pair of capacitors 166, 170 ($C_{1p}$, $C_{2p}$) at two terminals of the stage. Similarly, the right stage is capacitively isolated from the RF signal by a pair of capacitors 168, 172 ($C_{1n}$, $C_{2n}$). The left stage has two diodes 158, 162 ($D_{1p}$, $D_{2p}$). Similarly, the right stage has two diodes 160, 164 ($D_{1n}$, $D_{2n}$). Diodes 158, 162 and 160, 164 rectify the main isolated AC signal passing through blocking capacitors 166, 170 and 168, 172 to provide a DC output of the stage that is filtered by capacitors 154 and 156. In this type of resonant rectifier topology, the energy stored within the device capacitance is circulated losslessly during the on and off commutations of the diodes.

The switch 150, 152 ($Q_{1p}$, $Q_{1n}$) is activated when the opposing side is delivering voltage. The MOSFET switches in each bank 100, 102 control the connection from the electrodes 104, 106 to the bottom node 110 otherwise the diodes of the inactive rectifier would prevent current from flowing in the load loop. Because the MOSFET switches only need to block the voltage level of a single stage when in their off state, the highest voltage rating any semiconductor must have is equal to the output voltage of a single isolated stage. Isolated stages can be added to achieve the desired pulse output voltage.

A significant feature of this design is in how the MOSFETs switches are controlled. By simply placing a conductor loop around or near the resonant inductor $L_{Rp}$ or $L_{Rn}$ to form a coupled inductor pair with 178, 180 ($W_{g1}$, $W_{g2}$), an isolated voltage is induced in the gating circuit. One loop (and therefore gating circuit) is employed for each MOS- FETs residing in parallel with the opposing side's stages. Hence, whenever there is an RF signal present at the input of a rectifier block, the opposing side's MOSFETs will conduct. Because of this, pulses of varying length, repetition, and sign can be delivered to the load in any order simply by enabling and disabling the two RF signals at the inputs of the rectifier blocks.

To test the bipolar rectifier topology concept a prototype was implemented with 4 stages on each side. Each stage was designed to deliver 100 mA of current into a 10 kΩ resistive load to simulate a PEF system capable of treating contaminated water at a flow rate of 1 liter/min. The maximum voltage each stage can deliver is 600 V based on the ratings of the semiconductor devices for a total theoretical output of 2400 V positive and 2400 V negative or 4800 V differential. Component values can be found in Table 1.

TABLE 1

Component values used in proof of concept prototype

| $L_R$ [nH] | $C_1 - C_{2m}$ [pF] | $D_1 - D_{2m}$ [TPSC406B] | $C_{o1} - C_{om}$ [pF] | $Q_1 - Q_m$ [STD2N80K5] | $R_{g1} - R_{gm}$ [kΩ] | $C_{g1} - C_{gm}$ [pF] | $D_{g1} - D_{gm}$ [DFLS1100] |
|---|---|---|---|---|---|---|---|
| 589 | 660 | 600 V, 4 A | 330 | 600 V, 11 A | 1.1 | — | 100 V, 1 A |

As for $W_{g1}$ and $W_{g2}$, the number of turns on these inductors are chosen to provide enough voltage to fully enhance the MOSFETs. In this case we used one turn but the precise inductance value is not important and therefore not included in this table.

To verify the design the prototype bipolar rectifier unit was tested using two ENI1000 linear RF amplifiers.

Figure 2:
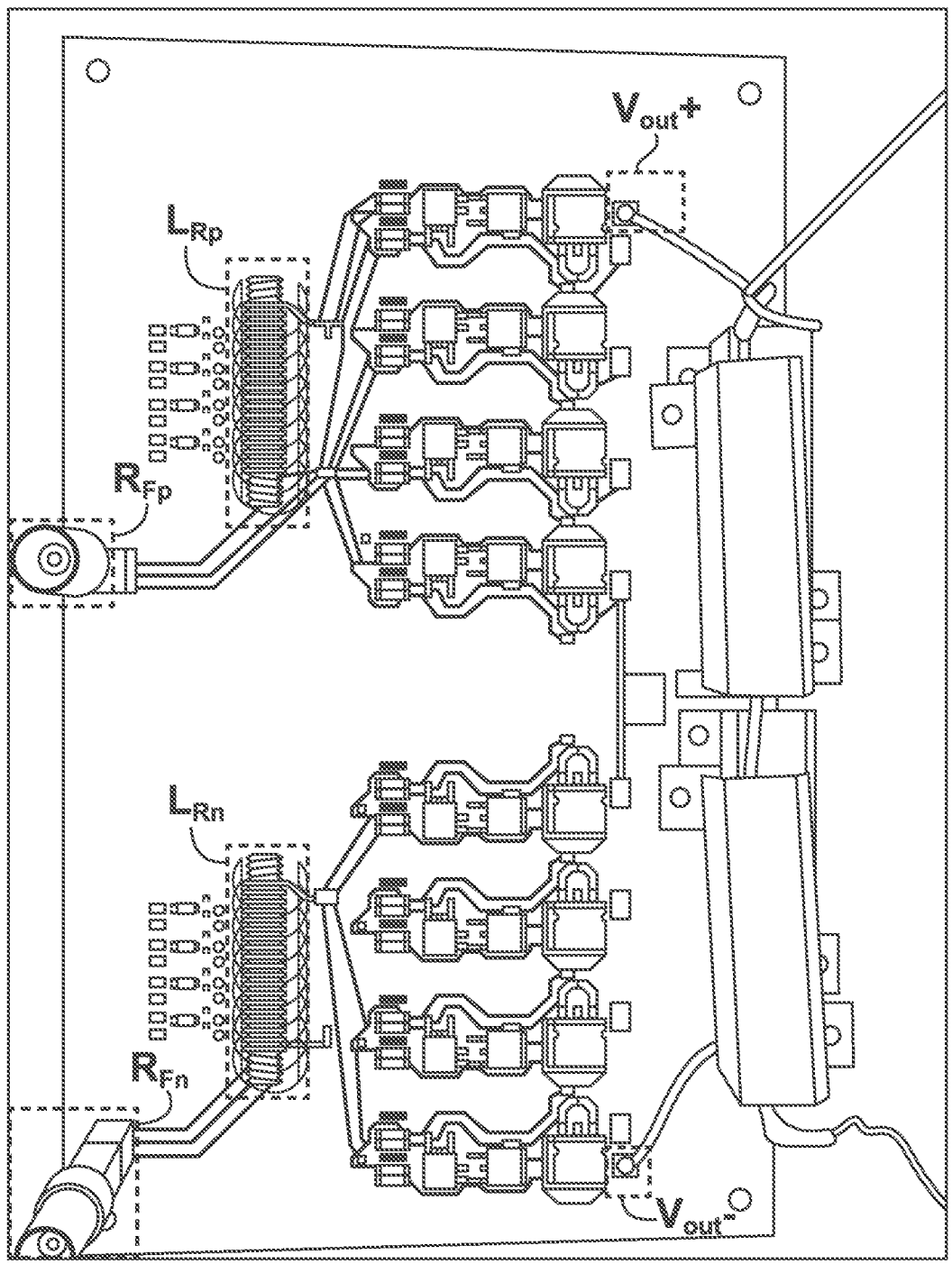
FIG. 2 is an illustration of a bi-polar test board, according to an embodiment of the invention.

FIG. 2 depicts the positive and negative sides of the bipolar rectifier populated on the same side of a single PCB for ease of visualization and testing. Note that the overall PCB footprint of the converter could be made much smaller and stacked if desired. $RF_{in1}$ and $RF_{in2}$ were connected to individual power amplifiers controlled by a 2-Channel Rigol DG5102 function generator to provide alternating 15 MHz bursts into the rectifier circuit. Output voltage waveforms were measured using a Picotech TA042 differential probe and an Agilent DS0-X 3034A digital oscilloscope.

FIGS. 3A-3D depict the load voltage for various pulse sequences. Note that for the bipolar case where there is dead-time between pulses the fall time is dictated by the RC time constant of the load resistance and the output capacitance of the rectifier block. However, when delivering a bipolar pulse the fall time is much shorter due to the opposing rectifier actively pulling down the voltage. The transient rise time of a positive or negative pulse is a bit under 5 μs and a total voltage reversal occurs in under 10 μs.

Figure 3A:
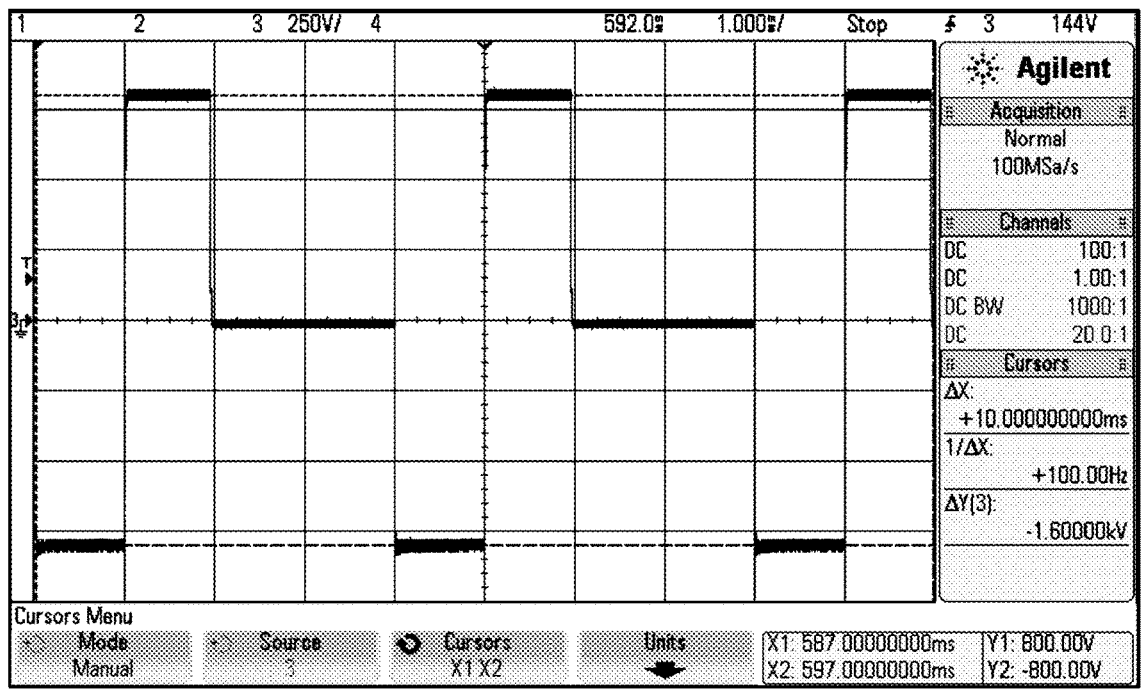
FIGS. 3A-D are graphs of bipolar pulses of various duration and repetition rates, as produced by a circuit of an embodiment of the invention.
Figure 3B:
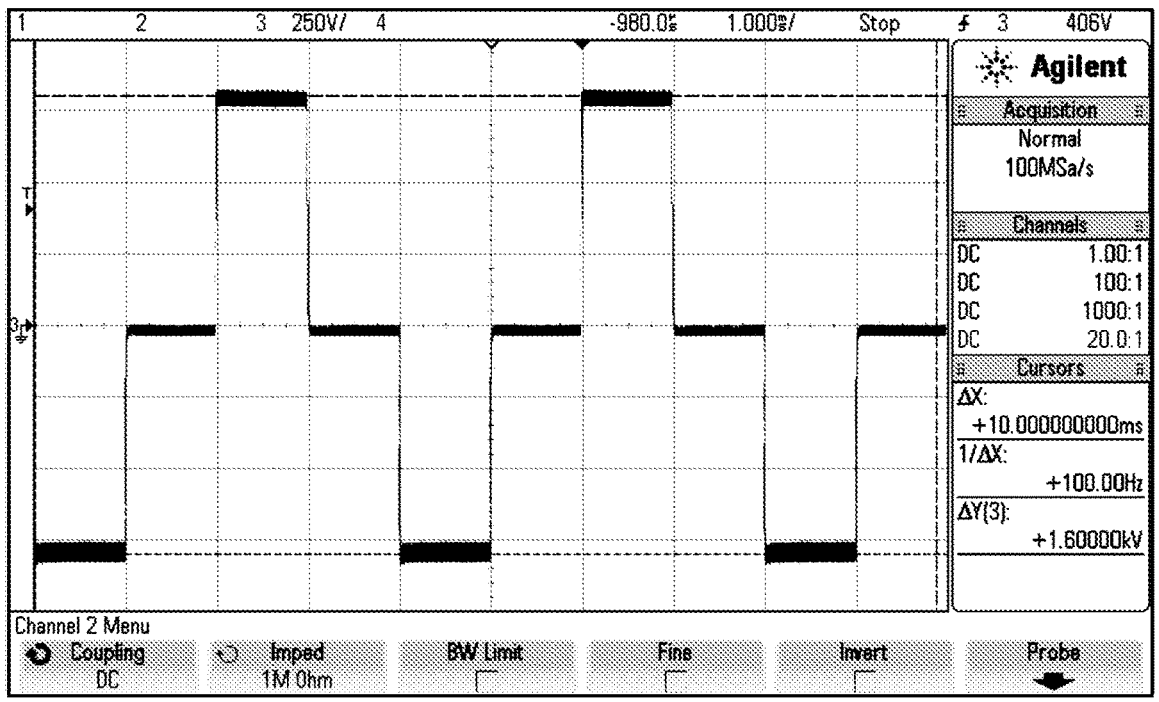
Figure 3C:
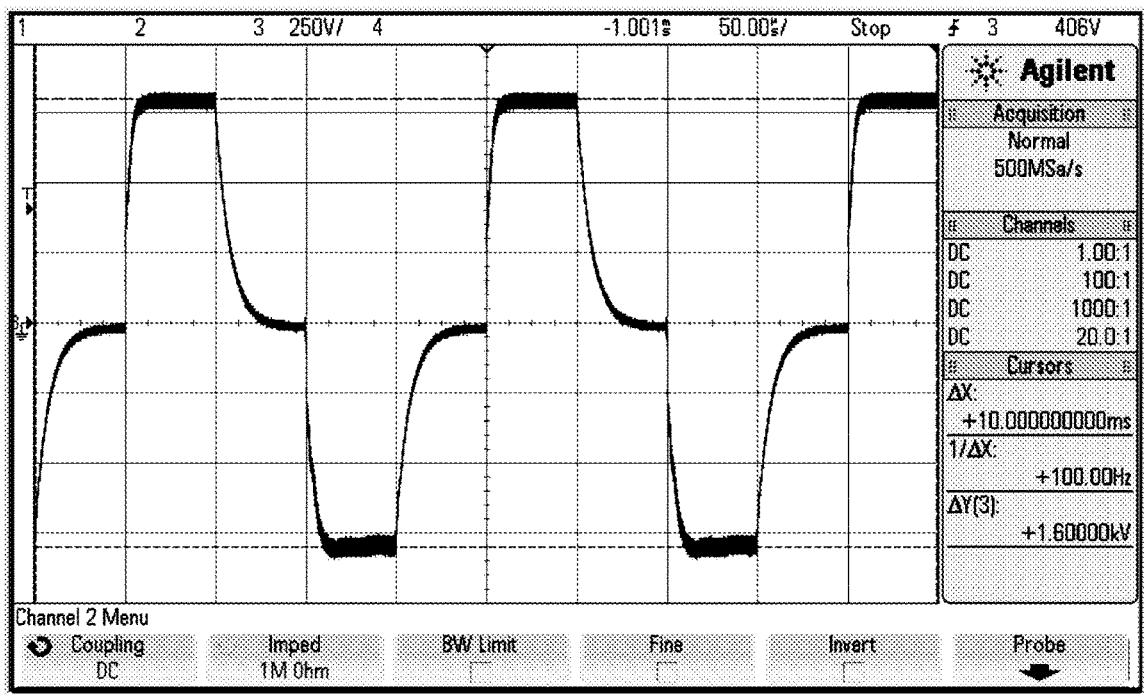
Figure 3D:
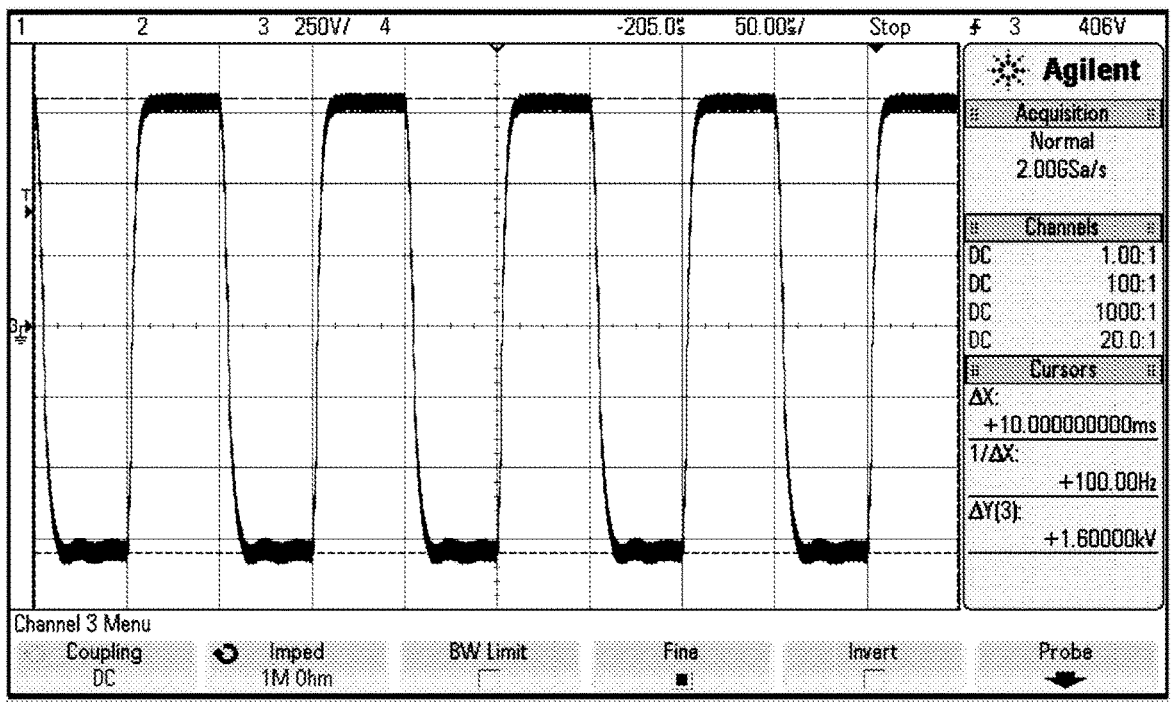

For the voltages waveforms presented in FIGS. 3A-3D, the pulse power is equal to 64 W for a voltage of 800 V. Initial measurements indicate rectifier efficiencies exceeding 90% for pulse widths from 50 μS to DC. Without heat sinking the rectifier can be run continuously without overheating under pulsed operation or DC. FIG. 3A shows bipolar±800 V 1 ms pulses with 2 ms blanking time. FIG. 3B shows bipolar±800 V 1 ms pulses with 1 ms blanking time. FIG. 3C shows bipolar±800 V 50 μs pulses with 50 μs blanking time. FIG. 3D shows bipolar±800 V 50 μs pulses with no blanking time.

Figure 4:
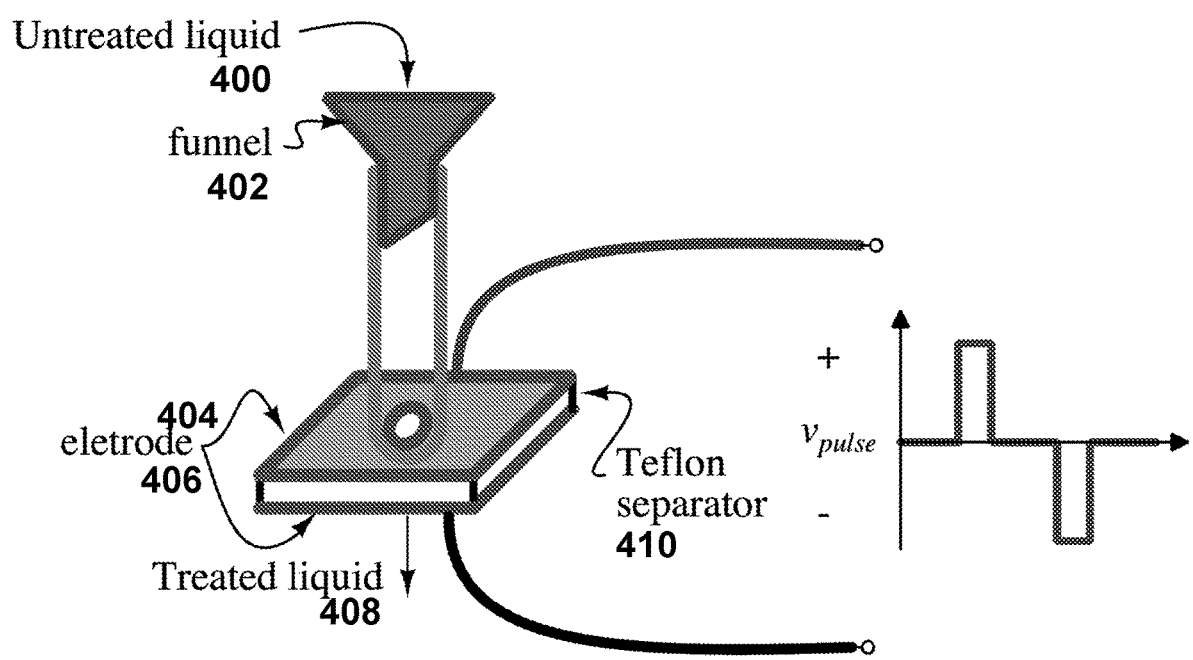
FIG. 4 is a schematic drawing of a PEF electrode experimental arrangement, according to an embodiment of the invention.

The viability of the bi-polar design was tested on a single hole electrode configuration consisting of copper electrodes 404, 406 separated by a teflon based dielectric 410, as shown in FIG. 4. Untreated liquid 400 enters a funnel 402 and passes through a hole in electrodes 404, 406 and teflon separator 410. The diameter of the hole through which treated liquid 408 flows is 0.5 mm, and the separation between the top and bottom electrode plates is 0.5 mm. These dimensions provide adequate field distribution and a average E-field of 1.6 kv/mm during an 800 V pulse.

To provide a constant flow of 30 ml/min with no air bubbles a gravity system with constant head pressure was used. This flow rate ensures that any bacteria in the liquid will receive at least 2 25 μs pulses (1 positive and 1 negative) during a total cycle time of 100 μs and 50% duty cycle.

Works in the technical literature have shown the PEF effectiveness of bi-polar pulses to be as good or better than mono-polar pulses. The focus of this experiment was to investigate whether electro-migration is reduced under bi-polar operation with pulses of 10 s of μs. The mono-polar and bi-polar electrodes were compared after treating 1 liter of bacteria-containing water (from a fish tank) with 25 μs and 50 μs pulses with an amplitude of ±800 V and 50% duty cycle.

Significant erosion exists on the mono-polar electrode while the bi-polar electrode exhibits no visible damage.

Moreover, tests with copper ion test strips confirms the presence of the metallic ions in the water treated with the mono-polar pulses. Water treated with monopolar pulses exhibits a copper ion concentration between 1 and 3 mg/l while the water treated with bi-polar pulses shows much lower concentration of the electrode metal.

Several variations of the circuit are possible. The simplest embodiment has two separately controlled resonant DC-DC converters in which a floating load is taken in and out of the circuit by active switches that are controlled by harnessing energy from resonant element of the circuit. The control for the active switch that determines the pulse and polarity of the load can be isolated such that multiple switches can be stacked for higher voltage applications. Additional switches can be configured to disconnect the output capacitance for faster pulses and transient response using the same control signal harnessed from the resonant element $L_R$.

This description presents a resonant converter design capable of producing high voltage bi-polar pulses efficiently with flexible pulse profiles for electroporation and other applications. By taking advantage of resonant elements within the circuit, bipolar operation can be attained using simple control strategies. Capacitive isolation allows for the addition of multiple stages to achieve higher voltage without increasing semi-conductor device stress. A switching frequency of 15 MHz relies on the fast transient response of the converter alone to create the pulses from zero without relying on a discharge capacitor and high voltage switch. A proof of concept design was shown to provide 800 V positive and negative square pulses from 10 s of μs to DC. Comparing mono-polar pulses to bi-polar pulses of equivalent lengths and repetition rates demonstrate that the bi-polar pulses reduce or eliminate electro-migration and errosion of the PEF electrodes.

The invention claimed is:

1. A resonant DC-DC converter for generating high voltage MHz bi-polar DC pulses, the resonant DC-DC converter comprising:
   a left multi-level resonant rectifier bank connected to a positive electrode and coupled via capacitive isolation to a left RF amplifier terminal;
   a right multi-level resonant rectifier bank connected to a negative electrode and coupled via capacitive isolation to a right RF amplifier terminal;
   wherein the left multi-level resonant rectifier bank and the right multi-level resonant rectifier bank are connected at a common node;
   wherein the left multi-level resonant rectifier bank comprises multiple left resonant rectifier stages;
   wherein the right multi-level resonant rectifier bank comprises multiple right resonant rectifier stages; and
   wherein each stage of the multiple left resonant rectifier stages and the multiple right resonant rectifier stages comprises capacitors for capacitively isolating the stage, an output capacitor, a MOSFET switch connected to an adjacent MOSFET switch of an adjacent stage, and a gating resonant circuit connected to the MOSFET switch, whereby MOSFET switches in the left multi-level resonant rectifier bank and the right multi-level resonant rectifier bank can be passively controlled by RF signals from a left RF amplifier and a right RF amplifier.

2. The resonant DC-DC converter of claim 1, wherein the gating resonant circuit comprises an inductor, capacitor, and resistor connected in parallel.

3. The resonant DC-DC converter of claim 1, wherein the left multi-level resonant rectifier bank is coupled to a left resonant inductor, and wherein the right multi-level resonant rectifier bank is coupled to a right resonant inductor.

4. The resonant DC-DC converter of claim 1, wherein each stage of the multiple left resonant rectifier stages and the multiple right resonant rectifier stages comprises two diodes for rectifying AC signals passing through the capacitors for capacitively isolating the stage.

5. The resonant DC-DC converter of claim 1, wherein the MOSFET switches respectively in the left multi-level resonant rectifier bank and in the right multi-level resonant rectifier bank are to generate pulses of opposite polarity, and wherein the pulses of opposite polarity are presented respectively to the positive and negative electrodes.

6. The resonant DC-DC converter of claim 1, wherein each of the MOSFET switches, in the respective left and right multi-level resonant rectifier banks, is to be active in an ON state for conducting current when said other of the each of the MOSFET switches is facilitating voltage being delivered via one of the pulses.

7. The resonant DC-DC converter of claim 1, wherein for any specific stage of the multiple left resonant rectifier stages and of the multiple left resonant rectifier stages, the MOSFET switch while in its OFF state is to block only an associated output voltage level to be delivered due to or from the specific stage.

8. The resonant DC-DC converter of claim 7, wherein the MOSFET switch of said specific stage is to have a maximum voltage rating which can tolerate the associated output voltage level but need not tolerate a greater voltage rating because of the MOSFET switch while in its OFF state is to block only the associated output voltage level.

9. The resonant DC-DC converter of claim 1, wherein the stages of the multiple left resonant rectifier stages and the stages of the multiple right resonant rectifier stages are configured so that additional stages can be added to achieve a higher desired pulse output level.

10. The resonant DC-DC converter of claim 1, wherein the stages of the multiple left resonant rectifier stages and the stages of the multiple right resonant rectifier stages are configured so that the total number of stages can be changed to achieve a different desired pulse output level.

11. The resonant DC-DC converter of claim 1, wherein each opposing gating resonant circuit, of a pair of respective multiple left resonant rectifier stages and multiple right resonant rectifier stages, includes a resonant inductor as part of the gating resonant circuit connected to the MOSFET switch.

12. The resonant DC-DC converter of claim 11, further including a left conductive control loop around or near the left resonant inductor of said respective multiple left resonant rectifier stages to facilitate an isolated voltage being induced in the gating resonant circuit associated with said multiple left resonant rectifier stages, and further including a right conductive control loop around or near the right resonant inductor of said respective multiple right resonant rectifier stages to facilitate an isolated voltage being induced in the gating resonant circuit associated with said multiple right resonant rectifier stages.

13. The resonant DC-DC converter of claim 1, wherein the gating resonant circuit of each stage includes an inductor to be arranged proximate to an opposing inductor of another gating resonant circuit for harnessing energy and controlling activation of the switches.

14. The resonant DC-DC converter of claim 1, wherein in each stage, the capacitive isolation does not rely on a transformer and each switch includes only a single field-effect transistor.

15. The resonant DC-DC converter of claim 1, wherein in each of the stages, the MOSFET switch: includes a control gate which is connected to the common node; and is passively controlled in response to the RF signals.

16. The resonant DC-DC converter of claim 1, further including in each stage an impedance bias circuit, including a pull-down resistor, to bias the MOSFET switch in the stage when a signal is not present to control the MOSFET switch.

17. The resonant DC-DC converter of claim 1, wherein while each stage is being stacked and operating as a multi-level resonant rectifier bank, in each of the stages the MOSFET switch is arranged to block voltages, as derived from the RF signals, in only the stage including the MOSFET switch.

* * * * *